United States Patent [19]
Braun

[11] 4,027,300
[45] May 31, 1977

[54] BUBBLE MEMORY PACKAGE

[75] Inventor: Roland Joseph Braun, Vestal, N.Y.

[73] Assignee: International Business Machines Corporation, Armonk, N.Y.

[22] Filed: May 24, 1976

[21] Appl. No.: 689,278

[52] U.S. Cl. .................... 340/174 TF; 340/174 VA
[51] Int. Cl.² ....................................... G11C 11/155
[58] Field of Search .............. 340/174 TF, 174 VA, 340/174 KA, 174 BC, 174 S, 174 SC

[56] References Cited
OTHER PUBLICATIONS

"Flat Packaging of Magnetic Bubble Devices," by Maegawa, et al. – IEEE Trans. on Magnetics, Mag 10, No. 3, Sept. 1974.
"Reflection Coil Packaging for Bubble Devices," by Takasu, et al., IEEE Trans. on Magnetics, Mag. 11, No. 5, Sept. 1975.

*Primary Examiner*—Vincent P. Canney
*Attorney, Agent, or Firm*—Cyril A. Krenzer

[57] ABSTRACT

Dual, slotted reflection plates for a bubble memory package use electrically and thermally conductive plates spaced just far enough apart to accept one or two levels of bubble memory devices between them. Each plate has a plurality of slots therein, each matching the appropriate portions of the coil generating the magnetic field for the bubble memory package.

13 Claims, 6 Drawing Figures

BUBBLE MEMORY PACKAGE

BACKGROUND OF THE INVENTION

1. Field of the Invention

This invention relates generally to memory packages and more particularly to an improved dual reflection plate arrangement for a bubble memory package.

2. Prior Art

Bubble memory systems, which have become well known in the art, utilize a rotational magnetic field to effect the domain propagation necessary to the operation and function of the bubble memory device. It has been proposed, for example, to produce this rotational magnetic field for bubble devices using flat coils, one mounted on top of the other, with or without a reflection plate to provide the desired rotational field effect. A typical example of such a reflection coil package for bubble devices is found in the article entitled "Reflection Coil Packaging for Bubble Devices" by Masaki Takasu, Harumi Maegawa, Toshiaki Sukeda and Kazuo Yamagishi of the Fujitsu Laboratories Limited, Kawasaki, Japan which was published in the IEEE Trans. Magn., March 1975. The arrangement therein disclosed has the disadvantages that each of the two coils obstructs the flux of the other coil to some extent and the magnetic flux of one has to penetrate two winding layers of the other coil on its way into and out of the active bubble device area, thereby requiring increased coil current for compensation. Also, the electrical characteristics of the two coils are not identical, as indicated in the aforementioned article, because of the different physical displacements of the coils from the active bubble device area. Furthermore, in such systems cooling presents a problem, since all power dissipators, coils and chips are directly adjacent to each other without interspersed cooling elements. Yet another difficulty with such a system is that it does not lend itself to double level design unless the number of coils is doubled or the bubble chips are placed on both sides of the coil pair.

OBJECTS AND SUMMARY OF THE INVENTION

Accordingly, it is a principal object of this invention to provide an improved bubble memory package which overcomes the foregoing disadvantages of the prior art devices.

Another object of the present invention is to provide an improved bubble memory package which has enhanced electrical and cooling efficiencies.

Yet another object of the present invention is to provide an improved bubble memory package which has simplified, symmetrical design with identical characteristics for the coils.

Still a further object of the present invention is to provide an improved bubble memory package which economically and uniformly utilizes a generated magnetic field. An additional object of the invention is to provide an improved bubble memory package which is readily adapted to provide multiple levels of bubble memory devices.

The foregoing and other objects are accomplished according to one aspect of the invention which utilizes a pair of flat field coils placed in orthogonal relationship to each other. Dual, slotted reflection plates are spaced just far enough apart from each other to accept one or two levels of bubble memory devices between them and each plate has three slots, the center one matching the center opening of its associated coil and the outer slots adjacent to the long straight edges of its associated coil. The dual, slotted reflection plates with the bubble devices therebetween are placed between the two orthogonal field coils.

DESCRIPTION OF THE PREFERRED EMBODIMENTS.

The foregoing and other objects, features and advantages of the invention will be apparent from the following more particular description of the preferred embodiments of the invention taken in conjunction with the above described accompanying drawings.

Figure 1:
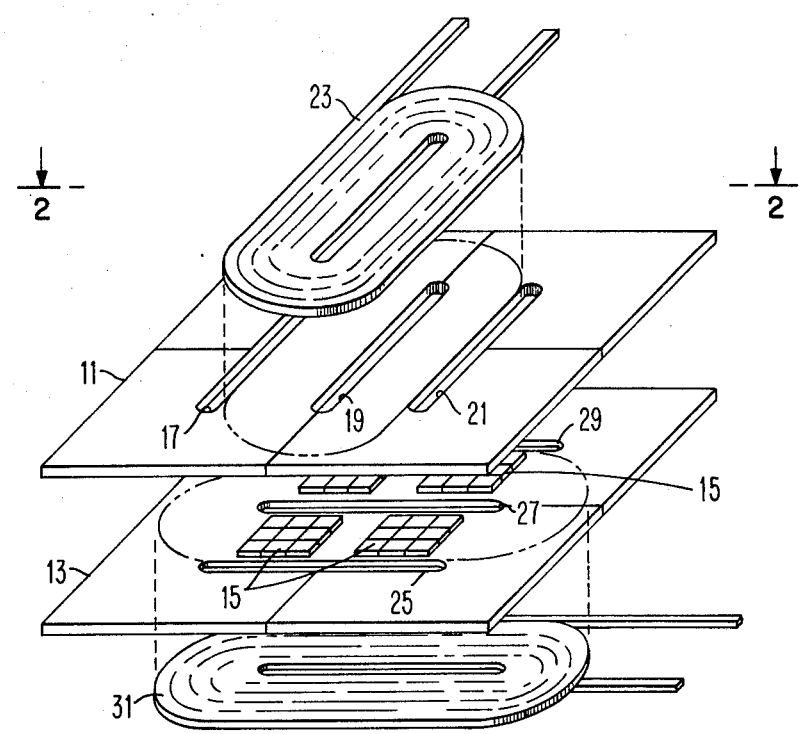
FIG. 1 is an exploded isometric view of a bubble memory package with a dual reflection plate arrangement according to the present invention.

Referring now to FIG. 1, the bubble memory package according to the present invention includes first and second slotted reflection plates 11, 13 with a first plurality of bubble chips 15 mounted on the plate 13. The plates 11, 13 are symmetrical and either one could be designated an X-field plate with the other being the Y-field plate. For ease of reference, plate 11 will be called the X-field plate and plate 13 the Y-field plate. The X-field plate, includes three elongated slots 17, 19 and 21 therein which are appropriately matched to the configuration of the associated X-field coil 23. The slot 19 in the plate 11 is aligned with the opening in the center of the field coil 23 and the slots 17 and 21 in the plate 11 are aligned with the outer edges of the field coil 23.

The Y-field plate 13, has three elongated slots 25, 27 and 29 therein which are appropriately aligned with its associated Y-field coil 31, the slot 27 being aligned with the opening in the center of the Y-field coil 31 and the slots 25 and 29 aligned with the elongated edges of the field coil 31. As indicated, the bubble memory devices 15 are located on the reflection plate 13 between that plate and the plate 11 with the slots in these two plates being orthogonal to one another. A similar plurality of bubble memory devices could be mounted on the underside of plate 11. The X-field coil 23 and the Y-field coil 31 are disposed on the other side of the plates 11 and 13, respectively.

Figure 2:
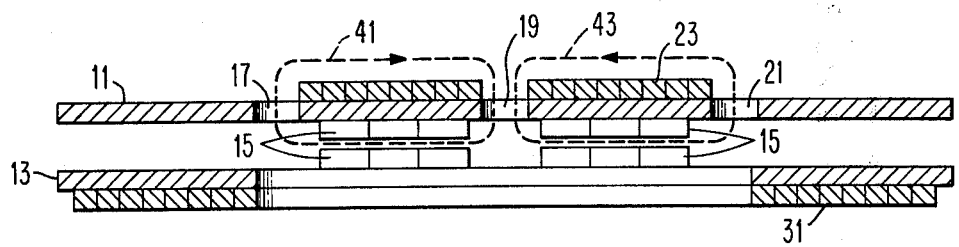
FIG. 2 is a sectional view taken through lines 2—2 of FIG. 1 of an assembled bubble memory package with a dual reflection plate arrangement according to the present invention.

As illustrated in FIG. 2, the field coils 23, 31 are assembled in close contact with the reflection plates 11, 13 but are electrically insulated from the plates. Also, as shown in FIG. 2, a second level of bubble memory device 15 is noted on the underside of the reflection plate 11. In a preferred embodiment, the width of the center slots 19, 27 in the reflection plates are about twice the distance between the two plates, as shown in FIG. 2. Typically, the distance between the plates would be on the order of 50 mils with the center slots being approximately 100 mils wide. Of course with wider slots, there is a lower magnetic reluctance, but this would necessarily increase the total lateral package size and could lower the heat sink effectiveness of the package. The outer slots, e.g. 17, 21, could be one-half the width of the center slot, but they can be wider if desired and, in fact, can even run all the way around the coil 23, thereby reducing the reflection plate to the same approximate size as the coil itself.

As shown in FIG. 2, the magnetic flux lines 41, 43 from the X-field coil 23 are channeled through the slots 17 and 19 and 21 and 19, entering the active bubble device area through the slot 19. Because of the 90° rotation between the slots in the plate 11 and the slots in the plate 13, very little flux from the coil 23 can escape through the plate 13, thereby improving the overall reflection effect of the plate 13 on the flux from the coil 23. Similarly, the plate 11 acts as an affective reflection barrier for most of the flux emanating from the Y-field coil 31 and passing through the slots 25, 27 and 29.

With the configuration illustrated in FIGS. 1 and 2, it is readily apparent that the reflection plates and coils are identical except for being rotated 90° with respect to one another. Therefore, the electrical characteristics of the coils and plates are identical and by appropriately varying the currents through the two coils, the desired rotational magnetic field effect is obtained to operate the bubble memory devices 15. With this configuration, the two reflection plates 11, 13 are also efficient heat sinks for the chips 15 as well as for the coils 23, 31, thereby improving the overall thermal characteristics of the package. Also, this package concept readily accepts two levels of bubble memory devices since a very uniform magnetic field exists over the adjacent surfaces of the two levels of bubble memory devices.

Figure 3:
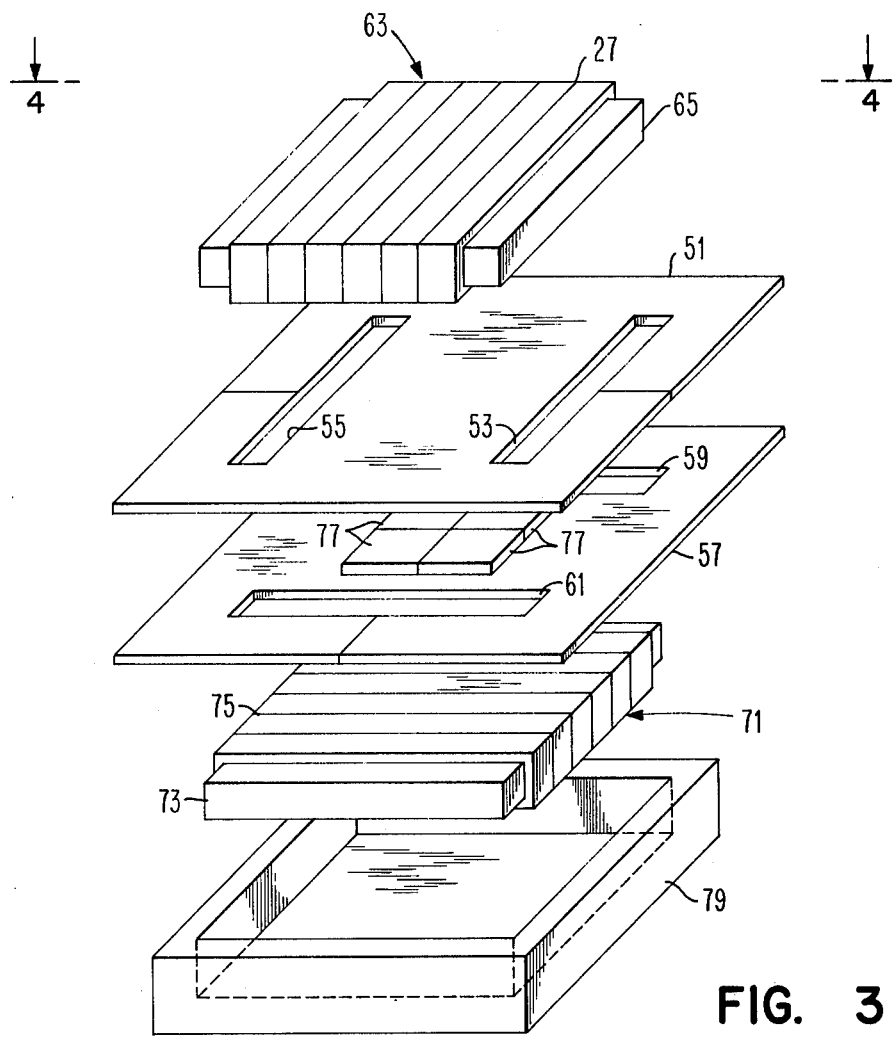
FIG. 3 is an exploded isometric view of another embodiment of a bubble memory package with a dual reflection plate arrangement according to the present invention.
Figure 4:
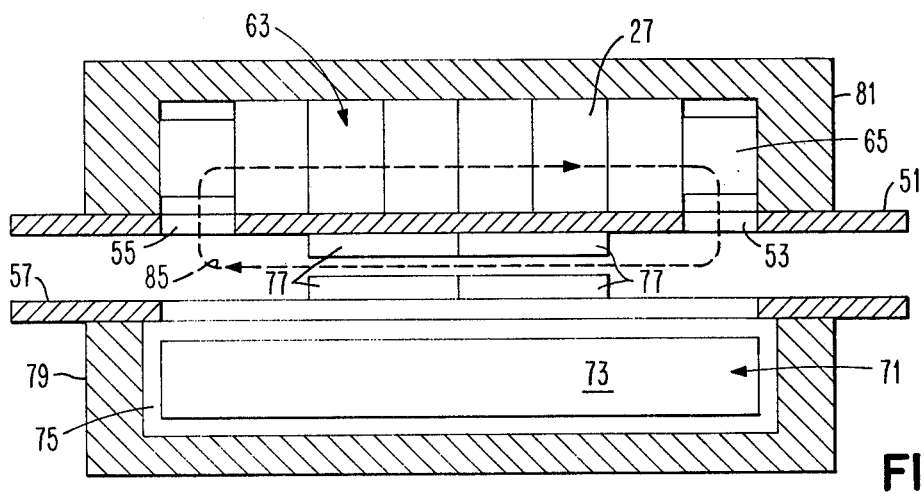
FIG. 4 is a sectional view taken along lines 4—4 of FIG. 3 of an assembled bubble memory packaging arrangement according to the present invention.

An alternate embodiment of the invention utilizing reflection plates having only two slots therein is shown in the isometric view of FIG. 3 and the end view of FIG. 4. The X-field plate 51 has slots 53 and 55 therein, and the Y-field plate 57 has slots 59 and 61. The X-field coil 63 contains a ferrite core 65 with coil windings 67 therearound. Similarly, the Y-field coil 71 includes a ferrite core 73 with a coil 75 wound around it. The bubble memory devices 77 are mounted on the respective reflection plates 51, 57. A shield 79 is adapted to fit over the Y-field coil 71. A similar shield 81, as shown in FIG. 4, encloses the X-field coil 63.

As can be seen in FIG. 4, the magnetic flux line 85 resultant from the X-field coil 63 enters the active area of the bubble devices through the slot 53 and exits the area through the slot 55. The use of the ferrite core 65 in the field coil 63 provides a flux closure path for the magnetic line indicated as 85.

Using this configuration, only two slots are required in each of the reflection plates 51, 57. Also, rather than having the two opposite magnetic fields 41, 43 resulting from the coil 23, as shown in FIG. 2, there is the singular magnetic field 85 resulting from the current in the coil 67.

The basic operation of the configuration shown in FIGS. 3 and 4 is very similar to the operation of the configuration shown in FIGS. 1 and 2. In both instances the reflection plates provide efficient heat sinks for the bubble memory devices and for the associated field coils. Also the plates act as affective barriers for the flux emanating from the opposing field coils.

Figure 5:
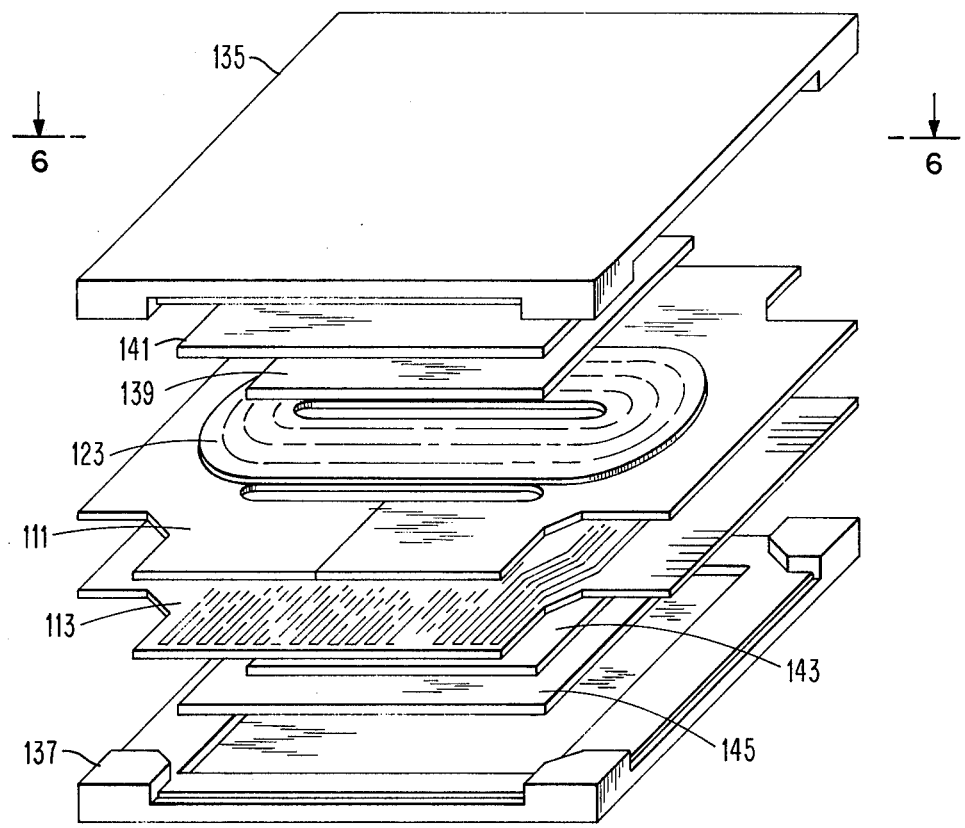
FIG. 5 is a complete bubble memory in isometric view.

A complete bubble memory module in exploded, isometric view is shown in FIG. 5. While this particular configuration utilizes the dual reflection plate embodiment of FIG. 1, it will be readily apparent that the embodiment of FIG. 3 could be utilized therein. The cross-sectional view of the bubble memory module shown in FIG. 6 will be taken in conjunction with the description of the module shown in FIG. 5. The module includes the two reflection plates 111, 113 with the bubble memory chips 115 mounted on the respective facing sides of the reflection plates 111, 113. In addition, the facing sides of the dual reflection plates 111, 113 contain appropriate circuitization to enable the establishment of the appropriate circuit connections between the bubble memory module and the driving apparatus (not shown). The appropriate field coils 123 and 131 are located approximate the outer sides of the dual reflection plates 111 and 113, respectively. The top of the module consists of a housing shell 135 and the bottom of the module is a housing shell 137. Between the upper field coil 123 on the upper reflection plate 111 and the upper housing shell 135 are contained a sheet of ferrite material 139 and a permanent magnet 141. Similarly, between the lower field coil 131 and the lower housing shell 137 are contained a sheet of ferrite material 143 and a second permanent magnet 145. Suitable spacers 147 and 149 separate the two reflection plates 111 and 113 and provide thermal contact therebetween. The spacer rings will have cutouts (not shown) for the circuit lines, but will directly contact the interior surfaces of the two reflection plates between the circuit lines providing a thermal bridge between the two module halves. This will insure substantial thermal equilibrium between the halves of the module.

The two field coils 123 and 131 are mounted on the outside of their respective reflection plates and are electrically insulated therefrom. The field coils can be held in position by a plastic insert, for example, through the center slot of the reflection plate or by the housing walls.

The ferrite plates 139 and 143 are mounted to the permanent magnet plates 141 and 145, respectively, which magnet plates are in turn mounted to the inside surfaces of the module housings 135 and 137, respectively. The package is designed so that around the periphery, each housing half is in direct thermal contact with its reflection plate and the two housing halves are held together, for example, by a plurality of screws or similar means and the housings are in magnetic contact at least in the four corner areas either directly or through the spacer rings 147 and 149, to provide a magnetic closure of the return path for the magnetic bias field, which is generated by the permanent magnets 141 and 145.

Figure 6:
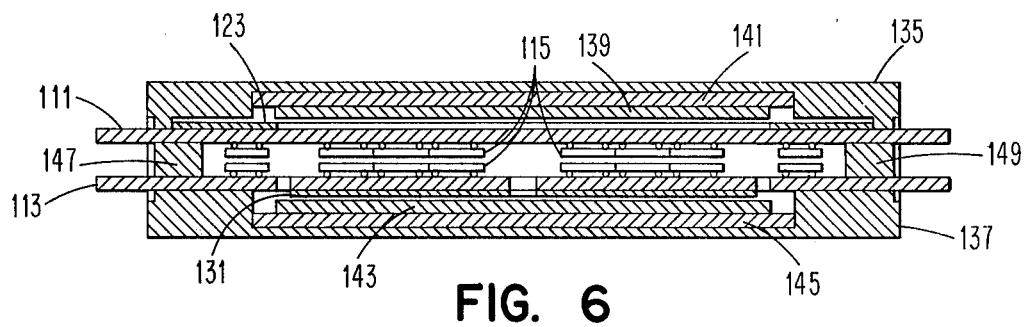
FIG. 6 is a sectional view of the bubble memory shown in FIG. 5.

The magnetic bias field is required to maintain stable bubbles of a certain size in the magnetic bubble material. This permanent magnet bias assures the basic nonvolatility of the bubble memory in the field which thereafter acts and reacts under the influence of the rotational magnetic field generated by the X and Y field coils operating in concert. The particular bias magnet structure of FIGS. 5 and 6 is referred to as a closed field structure which uses the two flat permanent magnet plates 141 and 145 on either side of the active bubble chip area in a serial flux path arrangement. The housing, consisting of shells 135 and 137 as well as the spacer elements, provides the flux closure on the outside for the magnetic bias field. The principal advantage of the closed field bias structure is that it is completely enclosed within the module and is completely shielded from external electromagnetic influences.

While the invention has been particularly shown and described with reference to preferred embodiments thereof, it will be understood by those skilled in the art that the foregoing and other changes in form and details may be made therein without departing from the spirit and scope of the invention.

I claim:

1. A modular subassembly for field accessed bubble memory devices comprising:
   at least one level of bubble memory devices;
   first and second electrically and thermally conductive reflection plates, each of said plates including a plurality of elongated parallel slots therein;
   first and second field coils adapted to generate first and second magnetic fields, respectively, associated with said first and second reflection plates, each coil oriented so that the magnetic field generated thereby is operative to pass through the elongated parallel slots in its respective reflection plate;
   means for mounting said bubble memory devices between said plates and for locating said plates with the elongated slots in one plate substantially perpendicular to the slots in said second plate with the respective coils of each plate mounted on the side of said plate away from said bubble memory devices; and,
   means for applying alternating currents to said coils to thereby generate substantially orthogonal magnetic field components in the space between said reflection plates containing said bubble memory devices.

2. The invention according to claim 1 additionally comprising:
   first and second ferrite plates positioned, respectively, over said first and second coils; and
   first and second permanent magnets positioned over said first and second ferrite plates.

3. The invention according to claim 2 additionally comprising a plurality of spacer elements positioned between said first and second reflection plates.

4. The invention according to claim 1 wherein said bubble memory devices are mounted directly on said reflection plates.

5. The invention according to claim 1 wherein said reflection plates include edge connector elements and wherein conductive circuit paths are placed on the surface of each plate to provide conductive circuit paths between said bubble memory devices and said edge connector elements.

6. The invention according to claim 1 wherein each of said coils is a flat wound coil with an elongated opening at the center thereof, one conductive lead coming from the center and the other conductive lead coming from one edge of the coil.

7. The invention according to claim 6 wherein each of said reflection plates includes three parallel elongated slots therein, the middle slot thereof being positioned in substantial alignment with the elongated opening of its respective coil and the outer slots being positioned proximate the outer edges of said coil.

8. The invention according to claim 5 additionally comprising an outer housing member adapted to enclose said modular assembly, said housing member being thermally conductive and adapted to dissipate heat from within said assembly.

9. The invention according to claim 3 wherein said spacer elements are made of thermally conductive material and are adapted to provide thermal bridging between the two module halves.

10. The invention according to claim 1 wherein each of said reflection plates includes two parallel elongated slots therein with its respective coil adapted to be positioned between said slots.

11. A modular subassembly for field accessed bubble memory devices comprising:
    at least one level of bubble memory devices;
    first and second electrically and thermally conductive reflection plates, each of said plates including at least three elongated parallel slots therein, at least one of said plates being adapted to accept said bubble memory devices;
    first and second flat field coils, respectively, associated with said first and second reflection plates, each of said coils being in close contact with, but electrically insulated from, its respective plate and oriented such that the center of said coil is approximately matched to the middle of said three slots and having its outer, long straight edges adjacent, respectively, the two outer slots of said plate; and
    means for locating said bubble memory devices between said plates with the slots in one plate substantially orthogonal to the slots in the second plate, with the respective coils of each plate mounted on the side away from said bubble memory devices.

12. The invention according to claim 11 wherein the width of said middle slot is approximately twice the spacing between said first and second conductive, reflection plates.

13. A modular subassembly for field accessed bubble memory devices comprising:
    at least one level of bubble memory devices;
    first and second electrically and thermally conductive reflection plates adapted to selectively concentrate and control the direction of generated magnetic fields;
    first and second field coils adapted to generate first and second magnetic fields, respectively, associated with said first and second reflection plates;
    means for positioning said bubble memory devices between said reflection plates;
    means for positioning said first and second coils proximate said first and second reflection plates, respectively, on the outer sides of said plates away from said bubble memory devices, said coils being positioned such that upon the application of currents thereto, orthogonal magnetic field elements are generated in the area between said reflection plates; and
    means for applying alternating currents to said coils.

* * * * *